United States Patent
Chen et al.

(10) Patent No.: US 11,525,881 B1
(45) Date of Patent: *Dec. 13, 2022

(54) SYSTEMS AND METHODS FOR CALIBRATION USING IMPEDANCE SIMULATION

(71) Applicant: Fluke Corporation, Everett, WA (US)

(72) Inventors: Liangzhu Chen, Shanghai (CN); Songnan Fan, Shanghai (CN); Lianqun Wu, Shanghai (CN); Milen Todorakev, Everett, WA (US); Jeff Gust, Everett, WA (US)

(73) Assignee: Fluke Corporation, Everett, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/404,760

(22) Filed: Aug. 17, 2021

(51) Int. Cl.
  *G01R 35/00* (2006.01)
  *G01R 17/02* (2006.01)
  *G01R 27/16* (2006.01)
  *G01D 5/243* (2006.01)

(52) U.S. Cl.
  CPC .......... *G01R 35/007* (2013.01); *G01D 5/243* (2013.01); *G01R 17/02* (2013.01); *G01R 27/16* (2013.01)

(58) Field of Classification Search
  CPC ...... G01R 35/007; G01R 17/02; G01R 27/16; G01R 31/3191; G01R 33/0023; G01R 35/00; G01R 35/005; G01D 5/243
  USPC ........................................................ 324/601
  See application file for complete search history.

(56) References Cited

U.S. PATENT DOCUMENTS

| | | | | |
|---|---|---|---|---|
| 4,041,382 A | * | 8/1977 | Washburn | G01K 15/00 324/705 |
| 4,936,309 A | * | 6/1990 | Cooper | A61B 5/0816 331/25 |
| 2013/0099800 A1 | * | 4/2013 | Francis | G01R 27/16 324/650 |
| 2017/0115328 A1 | * | 4/2017 | Seki | G01R 15/186 |

OTHER PUBLICATIONS

Fluke Calibration, "Getting Started Manual," 5730A Multifunction Calibrator, Rev. 1, Aug. 2013, 56 pages.
Fluke Calibration, "Operators Manual," 5730A Multifunction Calibrator, Rev. 1, Aug. 2013, 248 pages.

* cited by examiner

*Primary Examiner* — Tung X Nguyen
*Assistant Examiner* — Robert P Alejnikov, Jr.
(74) *Attorney, Agent, or Firm* — Seed IP Law Group LLP (57) ABSTRACT

A method and apparatus for calibrating an impedance measurement device are provided. The impedance measurement device outputs a first AC signal to a phase-locked current generator. The phase-locked current generator generates a second AC signal having a phase that is locked to a phase of the first AC signal and having an amplitude that is representative of a presented impedance having a known impedance value. The phase-locked current generator outputs the second AC signal to the impedance measurement device. The impedance measurement device performs an impedance measurement based on the second AC signal to produce a measured impedance value associated with the presented impedance. The impedance measurement device is calibrated based on the measured impedance value and the known impedance value of the presented impedance.

20 Claims, 6 Drawing Sheets

SYSTEMS AND METHODS FOR CALIBRATION USING IMPEDANCE SIMULATION

BACKGROUND

Technical Field

This application is directed to calibrating an impedance measurement device and, in particular, calibrating the impedance measurement device by simulating a presented impedance.

Description of the Related Art

Following manufacturing, measurement devices undergo a calibration process to verify performance within specifications. Existing techniques for calibrating impedance measurement devices rely on a fixed transformer arrangement for calibration. However, use of a fixed transformer arrangement does not allow for the flexibility in testing performance of the measurement over a wide range of presented impedances. It is very difficult to granularly step between impedances and obtain a high resolution simulated impedance by the transformer method.

BRIEF SUMMARY

Provided herein is use of a phase-locked current generator (also referred to as a phase-locked multifunction calibrator) in a system to enable simulating and presenting an impedance for calibrating an impedance measurement device. The impedance measurement device outputs a first AC signal that is an AC current signal if an external sampling resistance is used or an AC voltage signal if an internal sampling resistance is used. The phase-locked current generator generates a second AC signal in response to the first AC signal. The second AC signal is phase-locked with respect to the first AC signal and has the same frequency. The amplitude of the second AC signal sets the presented impedance for measurement by the impedance measurement device.

The second AC signal generated by the phase-locked current generator and an impedance device that may be a reference resistance model an impedance that is presented to the impedance measurement device in an ideal or very close manner. The second AC signal is phase-locked to the first AC signal.

The phase-locked current generator provides highly accurate setability and granularity of the presented impedance by allowing the amplitude of the second AC signal to be finely adjusted. The phase-locked current generator allows for adjusting the amplitude of the second AC signal in fine increments or steps, such as 1 nanoampere (nA). This, in turn, translates into a fine adjustment of the presented impedance.

The highly accurate setability and granularity of the presented impedance provides a flexibility to model a wide range of impedance values. The impedance measurement device may be calibrated for different presented impedance values through setting the amplitude of the second AC signal.

The impedance measurement device may be calibrated using multiple adjustment factors. The adjustment factors may be used to scale or adjust a measured impedance to a read-out impedance. The adjustment factors may be determined for respective presented impedances (for example, at both ends of a measurement range of the impedance measurement device). Further adjustment factors may be determined by extrapolating between the adjustment factors determined for the respective presented impedances.

The use of multiple adjustment factors accounts for variations in the adjustment to be performed on measured impedances by the impedance measurement device. Further, the use of multiple adjustment factors tailors the adjustment to the particular measured impedance or impedance range.

The second AC signal provided by the phase-locked current generator may be passed through the reference resistance, and the reference resistance may be included in the impedance measurement device instead of being part of a resistance box outside of the impedance measurement device.

The inclusion of the reference resistance results in reducing cable length used during calibration due to the fact that the inclusion results in forgoing additional wires connecting an external resistance. Consequently, noise, interference and working frequency artifacts introduced by wires and cable are mitigated.

A sampling resistance of the impedance measurement device may be selected or set such that an output of a digital-to-analog converter (DAC) of the impedance measurement device results in a voltage drop of a specified range across the sampling resistance. The specified range may be within a range of a phase-locked function of the phase-locked current generator.

Selecting the sampling resistance accordingly results in ensuring proper operability between the impedance measurement device and the phase-locked current generator.

DETAILED DESCRIPTION

Techniques for calibrating an impedance measurement device in a highly accurate manner and at multiple levels of impedance with finely granular setability are provided. A system is provided including the impedance measurement device and a phase-locked current generator (or a phase-locked current generating feature of a multifunction calibrator). Further, the system may include a sampling and a reference resistance that are internal to the impedance measurement device or external to the impedance measurement device. The system allows for simulating and presenting an impedance to the impedance measurement device to measure for purposes of calibrating the impedance measurement device.

The impedance measurement device outputs a stimulus AC signal to the phase-locked current generator. The phase-locked current generator locks to the phase of the stimulus AC signal and provides a phase-locked signal back to the impedance measurement device. The amplitude of the phase-locked signal dictates the presented impedance. The impedance measurement device measures the presented impedance.

Knowing the presented impedance and the measured impedance, a coefficient for scaling a future measured impedance to a calibrated read-out impedance may be determined. Multiple impedances can be presented to the impedance measurement device to determine the coefficient over a measurement range of the impedance measurement device.

The phase-locked current generator can provide finely granular setability. For example, the phase-locked current generator can provide amplitudes of the phase-locked signal of a granularity as low as one nanoampere (nA). Because the amplitude translates into an impedance, the granularity of the impedance can be as low as 4.5 microohm/ohm (μΩ/Ω).

Figure 1:
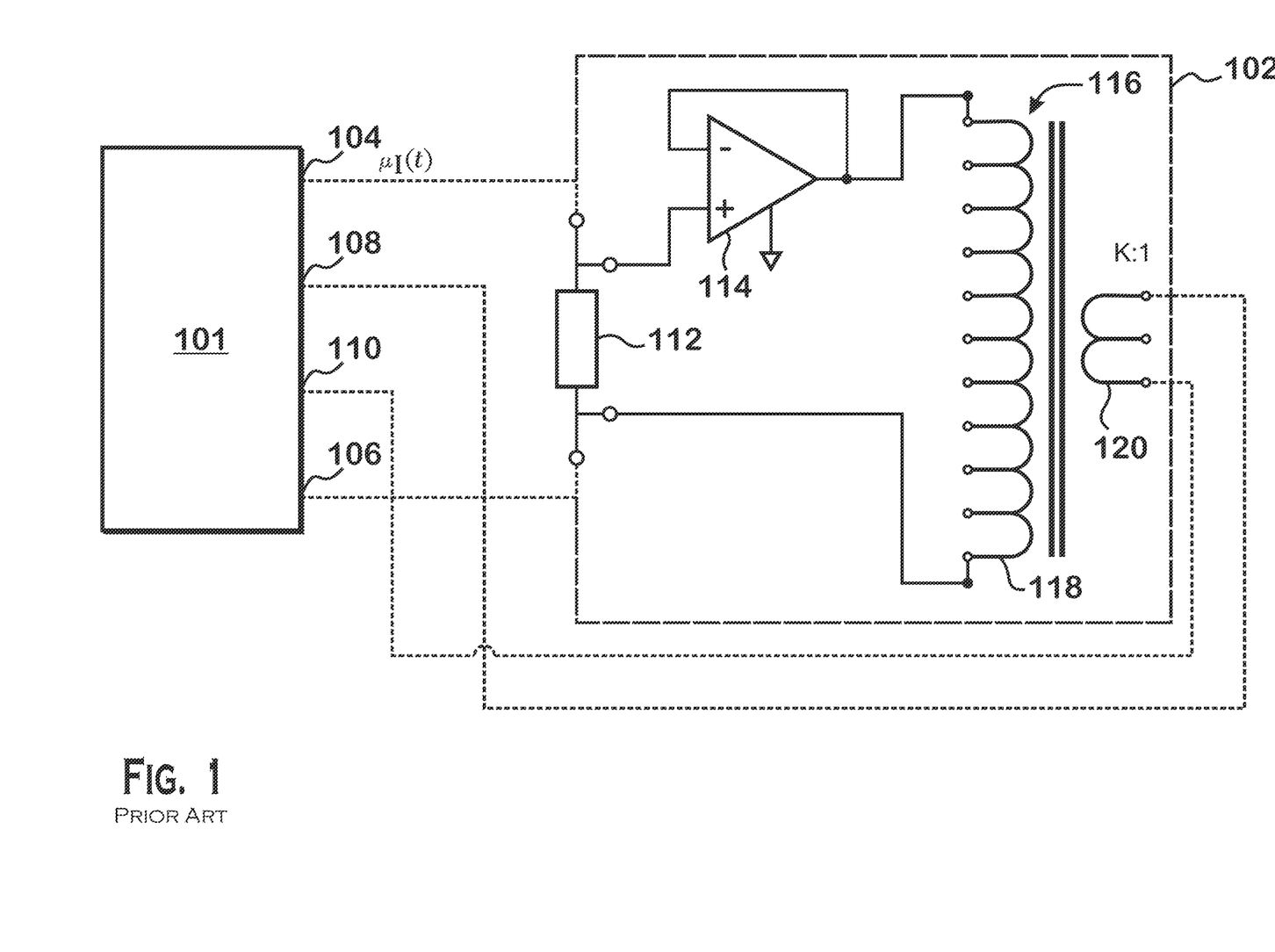
FIG. 1 shows a circuit diagram of conventional calibration of an impedance measurement device.

FIG. 1 shows a circuit diagram of conventional calibration of a device under test 101. During calibration, the device under test 101 is coupled to a calibration circuit 102. The device under test 101 may be any device configured to measure an impedance (or resistance). The device under test 101 may be an alternating current (AC) measurement device in that the device under test 101 measures the impedance based on outputting a stimulus current that is AC. The device under test 101 may measure the impedance of any device, such as a battery.

The device under test 101 has first, second, third and fourth terminals 104, 106, 108, 110. During calibration, the first and second terminals 104, 106 operate as output terminals, whereas the third and fourth terminals 108, 110 operate as input terminals to the device under test 101. The calibration circuit 102 includes a source resistance 112, a buffer 114 and a transformer 116 having a primary winding 118 and a secondary winding 120. The transformer 116 has a transformer ratio of K between the primary winding 118 and the secondary winding 120. It is noted that the source resistance 112 may be part of the calibration circuit 102 or may be part of a resistance box that is separate from and external to the calibration circuit 102.

The source resistance 112 has first and second terminals. The buffer 114 has a first input coupled to the first terminal of the source resistance 112. The buffer 114 has a second terminal coupled to an output of the buffer 114. The primary winding 118 has a first end coupled to the output of the buffer 114 and a second end coupled to the second terminal of the source resistance 112. The secondary winding 120 has first and second ends.

During calibration, the first and second terminals 104, 106 of the device under test 101 are coupled to the first and second terminals, respectively, of the source resistance 112. Further, the third and fourth terminals 108, 110 of the device under test 101 are coupled to the first and second ends, respectively, of the secondary winding 120.

The device under test 101 outputs, as a stimulus signal, a first AC signal ($\mu_I(t)$) to the calibration circuit 102. The first AC signal ($\mu_I(t)$) causes a voltage ($\mu_I(t)R$) to be generated across the source resistance 112, when R is the resistance of the source resistance 112. The buffer 114 buffers the voltage and outputs the buffered voltage to the primary winding 118. Operation of the transformer 116 results in a voltage ($\mu_I(t)$ R/K) across the secondary winding 120. The device under test 101 detects the voltage ($\mu_I(t)R/K$) and determines an impedance measurement based on the detected voltage (e.g., a ratio of the detected voltage to the first AC signal ($\mu_I(t)$)). The impedance simulated by the calibration circuit 102 may be represented as:

$$Z_x = \frac{\mu_I(t)R}{\mu_I(t)K} = \frac{R}{K} \quad \text{Equation (1)}$$

Conventional calibration suffers from a variety of drawbacks including inadequate uncertainty affected by the presence of random signal interference introduced by cable length and the traceability via the transformer method. Further, the source resistance 112 may be unstable, which negatively impacts the calibration of the device under test 101. In addition, the fixed transformer ratio only allows for one simulated impedance data point for calibrating the device under test 101. To obtain other simulated impedance data points, the transformer 116 may be replaced with other transformers having different ratios. However, the use of different transformers is cumbersome and may introduce additional calibration errors.

Figure 2:
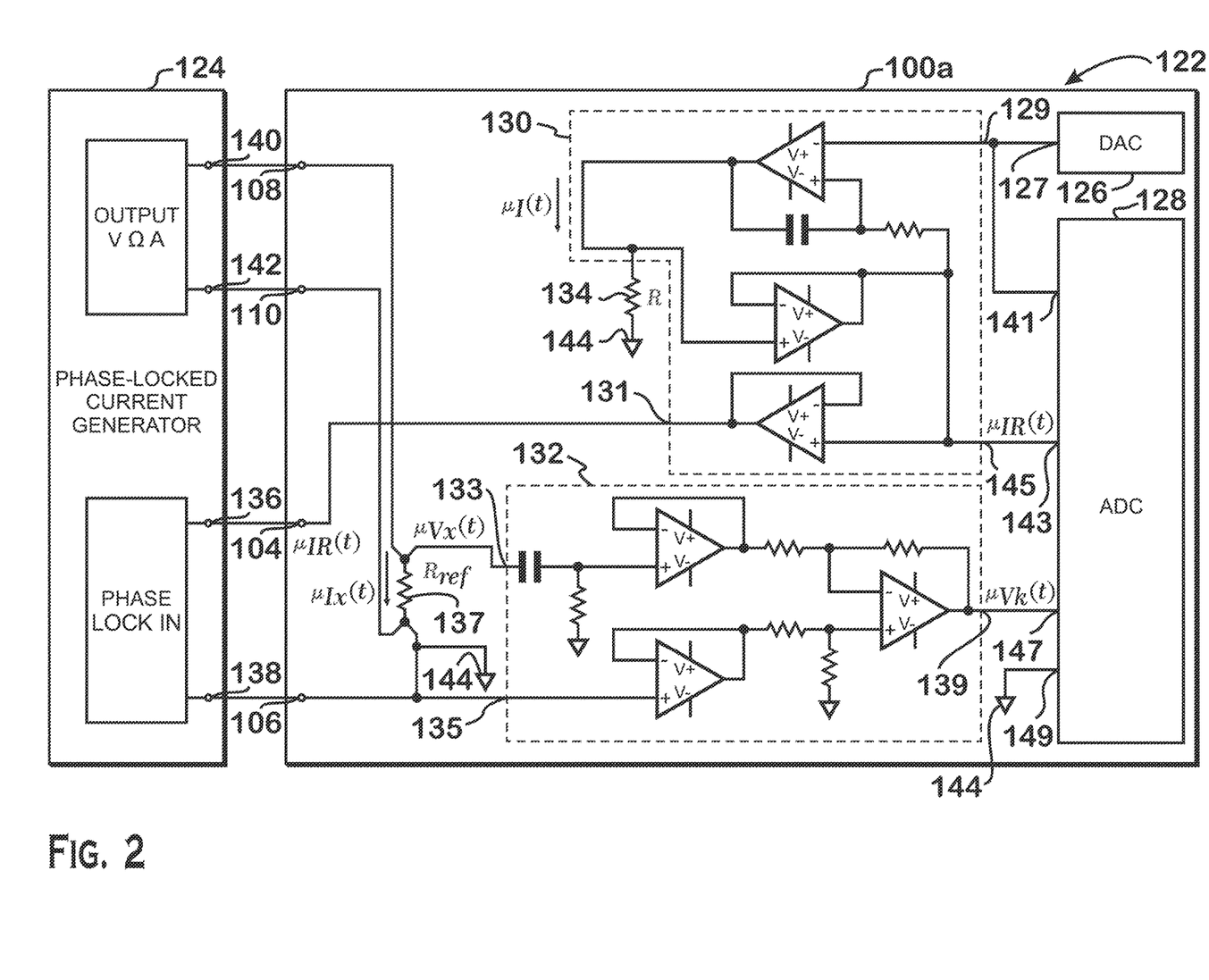
FIG. 2 shows a system for calibrating an impedance measurement device.

FIG. 2 shows a system 122 for calibrating an impedance measurement device 100*a*. The system 122 includes the impedance measurement device 100*a* and a phase-locked current generator 124. The impedance measurement device 100*a* includes a digital-to-analog converter (ADC) 126, an analog-to-digital converter (DAC) 128, first and second channels 130, 132, a sampling resistance 134 and a reference resistance 137. As described herein, the impedance measurement device 100*a* further includes first and second terminals 104, 106 and third and fourth terminals 108, 110. The phase-locked current generator 124 includes first and second inputs 136, 138 and first and second outputs 140, 142.

The phase-locked current generator 124 may be any type of device capable in phase lock operation. The phase-locked current generator 124 is configured to receive a first signal over the first and second inputs 136, 138 and output a second signal over the first and second outputs 140, 142 that is phase-locked to a phase of the first signal. Accordingly, the phase-locked current generator 124 outputs the second signal having a phase that corresponds to (or is the same as) the phase of the first signal. The phase-locked current generator 124 outputs the second signal having an amplitude that may be set or adjusted by a user. The phase-locked current generator 124 may be any phase-lock device and may lock a voltage signal or a current signal.

The phase-locked current generator 124 may, for example, be a multi-function calibrator, such as the Fluke® 5730A High Performance Multifunction Calibrator made by Fluke Corporation. The phase-locked current generator 124 may generally be a phase-lock device with output signal amplitude adjustment capability.

During calibration, the impedance measurement device 100*a* is coupled to the phase-locked current generator 124. The first and second terminals 104, 106 of the impedance measurement device 100*a* are coupled to the first and second inputs 136, 138 of the phase-locked current generator 124. In addition, the third and fourth terminals 108, 110 of the impedance measurement device 100*a* are coupled to the first and second outputs 140, 142 of the phase-locked current generator 124.

The digital-to-analog converter 126 has a first output 127 coupled to an input 129 of the first channel 130. The first channel 130 has a first output 131 coupled to the first terminal 104 of the impedance measurement device 100*a*. The first channel 130 is also coupled to a first terminal of the sampling resistance 134, whereby a second terminal of the sampling resistance 134 is coupled to a ground node 144. It is noted that although reference herein is made to ground, the ground node 144 may be any reference voltage node and may supply any reference voltage other than zero voltage.

The reference resistance 137 has first and second terminals that are respectively coupled to the third and fourth terminals 108, 110 of the impedance measurement device 100a. The second channel 132 has a first input 133 coupled to the first terminal of the reference resistance 137. The second channel 132 has a second input 135 coupled to the second terminal 106 of the impedance measurement device 100a, where the second terminal 106 of the impedance measurement device 100a is coupled to the ground node 144. The second channel 132 has an output 139. The analog-to-digital converter 128 has a first input 141 coupled to the output of the digital-to-analog converter 126, a second input 143 coupled to a second output 145 the first channel 130, a third input 147 coupled to the output of the second channel 132 and a fourth input 149 coupled to the ground node 144.

The sampling resistance 134, the reference resistance 137 or both may be outside the impedance measurement device 100a. For example, the resistances 134, 137 may be provided by a resistance box coupled to the impedance measurement device 100a, and the phase-locked current generator 124 may be coupled to the resistance box. However, inclusion of the resistances 134, 137 in the impedance measurement device 100a may be advantageous in that it results in reducing cable or wire length used to couple the resistance box to the impedance measurement device 100a and the phase-locked current generator 124. Reducing the cable length, in turn, results in reducing interference, noise or errors introduced by the cables.

During calibration, the digital-to-analog converter 126 generates and outputs a signal ($\mu_I(t)$) to the first channel 130. The first channel 130 may include a plurality of amplifiers, among others. The first channel 130 couples the output of the digital-to-analog converter 126 to the sampling resistance 134. In addition, the first channel 130 couples the sampling resistance 134 to the first input 136 of the phase-locked current generator 124. The first channel 130 processes the signal by at least buffering or amplifying the signal. The signal ($\mu_I(t)$) may be an AC current signal and may, accordingly, cause a voltage drop across the sampling resistance 134. The signal ($\mu_I(t)$) may have any frequency, such as one kilohertz (kHz), for example.

The first channel 130 produces a first AC signal ($\mu_{IR}(t)$) based on the voltage drop across the sampling resistance 134, which has a resistance value R, and outputs the first AC signal ($\mu_{IR}(t)$). The resistance value R of the sampling resistance 134 and the magnitude and frequency of the signal ($\mu_I(t)$) may be selected such that the resulting first AC signal ($\mu_{IR}(t)$) is within a range of a phase-locked function of the phase-locked current generator 124 thereby ensuring proper operability within the range of the phase-locked function.

The phase-locked current generator 124 receives the first AC signal ($\mu_{IR}(t)$) over the first input 136 and a reference voltage (ground) over the second input 138. The phase-locked current generator 124 determines a phase of the first AC signal ($\mu_{IR}(t)$). The phase-locked current generator 124 generates a second AC signal ($\mu_{Ix}(t)$) having a phase that is the same as the phase of the first AC signal ($\mu_{IR}(t)$). The second AC signal ($\mu_{Ix}(t)$) may be a current signal. The amplitude of the first AC signal ($\mu_{IR}(t)$) may be set and or adjusted by a user (such as, testing personnel) of the phase-locked current generator 124. In particular, the phase-locked current generator 124 may have a resolution for the amplitude that is as low as one nanoampere (nA). For example, depending on the amplitude, the minimum step size of the phase-locked current generator 124 may be 1, 10 or 100 nA. The Fluke® 5730A High Performance Multifunction Calibrator provides a settable amplitude with low root mean square (RMS) uncertainty. For example, the uncertainty for a 20 mA signal at 1 kHz is less than 0.03% with a 95% confidence. The high accuracy of the generated signal results in a high accuracy of the simulated or presented impedance.

The user, or a calibration device, may specify the amplitude of the second AC signal ($\mu_{Ix}(t)$), and the phase-locked current generator 124 may generate the second AC signal ($\mu_{Ix}(t)$) having the specified amplitude and having a phase that is locked to the phase of the first AC signal ($\mu_{IR}(t)$).

The phase-locked current generator 124 outputs the second AC signal ($\mu_{Ix}(t)$) to the impedance measurement device 100a. The second AC signal ($\mu_{Ix}(t)$) results in a voltage drop across the reference resistance 137, which has a resistance value of $R_{ref}$. The second channel 132 receives a first voltage signal ($\mu_{Vx}(t)$) representative of the voltage drop. The reference resistance 137 may be selected such that the resulting first voltage signal ($\mu_{Vx}(t)$) is within a range of the analog-to-digital converter 128 thereby ensuring proper operability within the range of the analog-to-digital converter 128.

The first voltage signal ($\mu_{Vx}(t)$) may be a millivolt or microvolt signal and may, for example, have a voltage level that is between 1 microvolt ($\mu V$) and 1 millivolt (mV) or between 1 mV and one volt (V). Particularly, the first voltage signal ($\mu_{Vx}(t)$) may have a voltage between 10 nanovolt (nV) and 1 mV. Further, the presented impedance may be less than 1 milliohm (m$\Omega$) or less than 0.5 m$\Omega$. Accordingly, the response of the impedance measurement device 100a may be tested at the small signal level where noise and interference is more pronounced than with a higher voltage signal. The second channel 132 also receives ground voltage. The second channel 132 includes a plurality of amplifiers that perform differential processing on the first voltage signal ($\mu_{Vx}(t)$). The second channel 132 outputs a second voltage signal ($\mu_{Vk}(t)$) to the analog-to-digital converter 128. The analog-to-digital converter 128 also receives the signal ($\mu_I(t)$) output by the digital-to-analog converter 126. Accordingly, the analog-to-digital converter 128 may digitize the signal ($\mu_I(t)$), and the impedance measurement device 100a may the effects of the effects, artifacts or noise introduced by the first channel 130 on the first AC signal ($\mu_{IR}(t)$). It is noted that traceability analysis may be performed on the signaling path from the digital-to-analog converter 126 and back to the analog-to-digital converter 128 for metrological compliance. The traceability analysis may show and document measurement uncertainty as signals traverse the path. The traceability analysis may be used to evaluate uncertainty in measurement resulting in variability (for example, margins of error) of devices along the signaling path, such as the sampling and reference resistances 134, 137.

The system 122 presents a simulated impedance to the impedance measurement device 100a. Operation of the arrangement of the phase-locked current generator 124 together with the sampling and reference resistances 134, 137 emulates a settable impedance in that the arrangement receives the signal ($\mu_I(t)$) as a current signal and provides the first voltage signal ($\mu_{Vx}(t)$) representative of the emulated settable impedance provided by the arrangement. Phase-locking the second AC signal ($\mu_{Ix}(t)$), and consequently the first voltage signal ($\mu_{Vx}(t)$), to the first AC signal ($\mu_{IR}(t)$) emulates the responsiveness of a physical impedance (or an "ideal" physical impedance) to a stimulus signal.

The amplitude settability of the phase-locked current generator 124 enables simulating impedances with a fine resolution. For example, the Fluke® 5730A High Performance Multifunction Calibrator can result in a resolution that is as low as 4.5 microohm/ohm (μΩ/Ω). The Fluke® 5730A High Performance Multifunction Calibrator has a resolution of 1 nA for amplitude between 10 and 220 microampere (μA). Accordingly, at the 10 μA amplitude level, the resolution is 1 nA/10 μA (or 100 μA/A). It is noted that μA/A corresponds to parts per million (ppm). At the upper end of the range of 220 μA, the resolution improves by a factor of 22 (due to the fact that the upper end of the range is 22 times the lower end of the range) becoming 100/22 μA/A (or 4.5μ/A). The resolution of a current source providing the second AC signal ($\mu_{Ix}(t)$) directly translates to an impedance source resolution (in μΩ/Ω) obtained through the first voltage signal ($\mu_{Vx}(t)$).

The amplitude resolution of the phase-locked current generator 124 allows calibrating the impedance measurement device 100a (or controller thereof as described herein) for finely granular impedance levels and over a wide range of impedances. The phase-locked current generator 124 may be operated to step through the amplitude with the finest granularity provided by the phase-locked current generator 124, e.g., at the nanoampere level, in order to calibrate the impedance measurement device 100a for microohm levels of a simulated impedance.

The impedance measurement device 100a detects an impedance ($Z_{0x}$) as a ratio between the second voltage signal ($\mu_{Vk}(t)$) and the first AC signal ($\mu_{IR}(t)$), i.e.:

$$Z_{0x} = \frac{\mu_{Vk}(t)}{\mu_{IR}(t)}. \qquad \text{Equation (2)}$$

The impedance ($Z_x$) presented by the phase-locked current generator 124 may be represented as a ratio of the first voltage signal ($\mu_{Vx}(t)$) to the signal ($\mu_I(t)$) output by the digital-to-analog converter 126. That is, the presented impedance is:

$$Z_x = \frac{\mu_{Vx}(t)}{\mu_I(t)}. \qquad \text{Equation (3)}$$

To evaluate the accuracy of the impedance measurement device 100a, the detected impedance is traced to the presented impedance. The first voltage signal ($\mu_{Vx}(t)$) is a product of reference resistance 137 (denoted '$R_{ref}$') and the second AC signal ($\mu_{Ix}(t)$). The second AC signal ($\mu_{Ix}(t)$) has an RMS value of $A_{Ix}$ and a phase shift ($\Delta\theta_s$) generated by the phase-locked current generator 124. Accordingly, the presented impedance can be represented as:

$$Z_x = \frac{\mu_{Ix}(t) R_{ref}}{\mu_I(t)} = \qquad \text{Equation (4)}$$
$$\frac{A_{Ix}\cos(2\pi ft + \Delta\theta_s) R_{ref}}{A_I \cos 2\pi ft} = \frac{A_{Ix} R_{ref}}{A_I}(\cos(\Delta\theta_s) + j\sin(\Delta\theta_s)),$$

where $A_I$ is the RMS of the signal ($\mu_I(t)$) output by the digital-to-analog converter 126.

The presented impedance ($Z_x$) has a real part ($R_x$) and an imaginary part ($X_x$) that are represented as:

$$R_x = \frac{A_{Ix} R_{ref}}{A_I} \cos\Delta\theta_s \qquad \text{Equation (5)}$$
$$X_x = \frac{A_{Ix} R_{ref}}{A_I} \sin\Delta\theta_s,$$

respectively.

As described herein, in response to receiving the first voltage signal ($\mu_{Vx}(t)$), the second channel 132 outputs the second voltage signal ($\mu_{Vk}(t)$) to the analog-to-digital converter 128. The second channel 132 applies a gain ($k_V$) and a phase shift ($\Delta\theta_V$) to the second voltage signal ($\mu_{Vk}(t)$) in relation to the first voltage signal ($\mu_{Vx}(t)$). Accordingly, the second voltage signal ($\mu_{Vk}(t)$) may be represented as:

$$\mu_{Vk}(t) = k_V A_{Ix} R_{ref} \cos(2\pi ft + \Delta\theta_s + \Delta\theta_V). \qquad \text{Equation (6)}$$

The analog-to-digital converter 128 also directly receives the signal $\mu_I(t)$ output by the digital-to-analog converter 126. Furthermore, the analog-to-digital converter 128 receives the first AC signal ($\mu_{IR}(t)$) from the first channel 130 having undergone a phase shift ($\Delta\theta_I$). The first AC signal ($\mu_{IR}(t)$) may be represented in terms of the RMS ($A_I$) of the signal ($\mu_I(t)$) and the sampling resistance 134 (R) as:

$$\mu_{IR}(t) = A_I R \cos(2\pi ft + \Delta\theta_I). \qquad \text{Equation (7)}$$

Thus, the detected impedance ($Z_{0x}$) of Equation (2) may be represented as:

$$Z_{0x} = \frac{\mu_{Vk}(t)}{\mu_{IR}(t)} = \frac{k_V A_{Ix} R_{ref}}{A_I R} \cos(\Delta\theta_s + \Delta\theta_V - \Delta\theta_I) + \qquad \text{Equation (8)}$$
$$\frac{k_V A_{Ix} R_{ref}}{A_I R} \sin(\Delta\theta_s + \Delta\theta_V - \Delta\theta_I).$$

From Equation (8), the real part, imaginary part and phase of the detected impedance ($Z_{0x}$) may be represented as:

$$R_{0x} = \frac{k_V A_{Ix} R_{ref}}{A_I R} \cos(\Delta\theta_s + \Delta\theta_V - \Delta\theta_I) \qquad \text{Equation (9)}$$
$$X_{0x} = \frac{k_V A_{Ix} R_{ref}}{A_I R} \sin(\Delta\theta_s + \Delta\theta_V - \Delta\theta_I),$$
$$\theta_{0x} = \Delta\theta_s + \Delta\theta_V - \Delta\theta_I$$

respectively.

The detected impedance ($Z_{0x}$) undergoes sampling and correlation processing in the impedance measurement device 100a. The impedance measurement device 100a measures the impedance based on the detected impedance ($Z_{0x}$). The measured impedance may be represented as:

$$Z_{0x\_} = R_{0x\_} j X_{0x\_} = |Z_{0x\_}| \cos\theta_{0x\_} + j|Z_{0x\_}| \sin\theta_{0x\_}, \qquad \text{Equation (10)}$$

where $R_{0x\_}$, $X_{0x\_}$, $|Z_{0x\_}|$ and $\theta_{0x\_}$ are the real part, imaginary part, modulus and phase, respectively, of the measured impedance ($Z_{0x\_}$).

The impedance measurement device 100a shifts the phase of the measured impedance ($Z_{0x\_}$) by a phase ($\Delta\theta_0$) to account for the phase shift ($\theta_{0x}$) of Equation (10). Shifting the phase results in a phase-shifted measured impedance ($Z_{\theta 0x}$). It is noted that the phase ($\Delta\theta_0$) compensates for phase changes due to the processing (e.g., filtering and amplification) performed by the second channel 132. The processing performed by the first channel 130 is compensated by the phase-locked current generator 124. The phase-locked current generator 124 outputs the second AC signal ($\mu_{Ix}(t)$) as an independent signal that is phase-locked to the first AC signal ($\mu_{IR}(t)$). The second AC signal ($\mu_{Ix}(t)$) has the same phase as the first AC signal ($\mu_{IR}(t)$). However, with the exception of changes to the phase, the second AC signal ($\mu_{Ix}(t)$) is not affected by the conditioning or processing performed by the first channel 130.

The phase-shifted measured impedance ($Z_{\theta 0x}$) can be represented as:

$$Z_{\theta 0x} = R_{\theta 0x} + jX_{\theta 0x} = |Z_{0x\_}|\cos(\theta_{0x} - \Delta\theta_0) + j|Z_{0x\_}|\sin(\theta_{0x} - \Delta\theta_0),\quad \text{Equation (11)}$$

where $R_{\theta 0x}$ and $X_{\theta 0x}$ are the real part and the imaginary part, respectively, of the phase-shifted measured impedance ($Z_{\theta 0x}$).

The impedance measurement device 100a may employ an adjustment factor ($k_{0x}$) to adjust the phase-shifted measured impedance ($Z_{\theta 0x}$) to a read-out impedance representing the presented impedance ($Z_x$). The adjustment factor ($k_{0x}$) may be a multiplicative factor, whereby the impedance measurement device 100a may multiply the phase-shifted measured impedance ($Z_{\theta 0x}$) by the adjustment factor ($k_{0x}$) to obtain the read-out impedance representing the presented impedance ($Z_x$). Accordingly, the read-out impedance may be represented as $$Z_x = k_{0x} Z_{\theta 0x}. \quad \text{Equation (12)}$$

The adjustment factor ($k_{0x}$) may vary linearly over an impedance range (for example, over a range of the presented impedance ($Z_x$)). Accordingly, the phase-locked current generator 124 may present at least two impedances to the impedance measurement device 100a. The impedance measurement device 100a may determine the respective adjustment factors for the at least two measured impedances. The impedance measurement device 100a may extrapolate between the adjustment factors to determine a linear (or other type of) relationship between measured impedance and adjustment factor. In an embodiment, the presented impedances may correspond to both ends of an impedance measurement range of the impedance measurement device 100a. The adjustment factors of the entire range of measurement for which the impedance measurement device 100a is rated may be extrapolated between the adjustment factors for both ends of the measurement range.

It is noted that determination of the adjustment factors of multiple impedances accounts for testing variations over the range of impedances for which the impedance measurement device 100a is rated. The adjustment to the measured impedance may change over the impedance range. Accordingly, determining multiple adjustment factors over the impedance range aids in accounting for variations in the adjustment to be performed by the impedance measurement device 100a

It is noted that impedance measurement may be performed based on the real part of the phase-shifted measured impedance ($Z_{\theta 0x}$). Accordingly, the imaginary part of the measurement may be ignored. Furthermore, determining the adjustment factor ($k_{0x}$) using Equation (12) may be performed based on the real parts of the phase-shifted measured impedance ($Z_{\theta 0x}$) and the presented impedance ($Z_x$). The imaginary counterparts of the real impedances may be ignored.

An uncertainty of the presented impedance ($Z_x$) is attributed to multiple sources of uncertainty. The sources of uncertainty include (1) an uncertainty (denoted '$\emptyset_{Ix}$') in the RMS of the signal ($\mu_I(t)$) output by the digital-to-analog converter 126, (2) an uncertainty (denoted '$\emptyset_{ai}$') in an RMS of the second AC signal ($\mu_I(t)$), (3) an uncertainty (denoted '$\emptyset_{ref}$') in the reference resistance 137 and (4) an uncertainty (denoted '$\emptyset_{\theta rx}$') in the phase shift $\Delta\theta_s$ generated by the phase-locked current generator 124. The compound uncertainty (also referred to the standard uncertainty) of the real part ($R_x$) of the presented impedance ($Z_x$) can be expressed as:

$$u_{c(Rx)} = \sqrt[2]{(\emptyset_{Ix})^2 + (\emptyset_{ai})^2 + (\emptyset_{ref})^2 + (\emptyset_{\theta rx})^2}. \quad \text{Equation (13)}$$

For a full scale measurement range of 3 m$\Omega$ and the second AC signal ($\mu_{Ix}(t)$) having an amplitude of 300 mA and a frequency of 1 kHz, the compound uncertainty can be expressed as:

$$u_{c(Rx\_3m)} \approx \begin{cases} 0.039\% & 50uA \le A_{Ix} \le 5mA, 0.05m\Omega \le R_{x\_3m} \le 5.00m\Omega \\ 0.047\% & 30uA \le A_{Ix} \le 50uA, 0.03m\Omega \le R_{x\_3m} \le 0.05m\Omega \\ 0.058\% & 20uA \le A_{Ix} \le 30uA, 0.02m\Omega \le R_{x\_3m} \le 0.03m\Omega \\ 0.095\% & 10uA \le A_{Ix} \le 20uA, 0.01m\Omega \le R_{x\_3m} \le 0.02m\Omega \end{cases} \quad \text{Equation (14)}$$

The extended uncertainty having a 95% confidence level is obtained by multiplying the compound uncertainty by a factor of two. Accordingly, the extended uncertainty can be expressed as:

$$u_{c_x(Rx\_3m)} \approx \begin{cases} 0.078\% & 50uA \le A_{Ix} \le 5mA, 0.05m\Omega \le R_{x\_3m} \le 5.00m\Omega \\ 0.094\% & 30uA \le A_{Ix} \le 50uA, 0.03m\Omega \le R_{x\_3m} \le 0.05m\Omega \\ 0.116\% & 20uA \le A_{Ix} \le 30uA, 0.02m\Omega \le R_{x\_3m} \le 0.03m\Omega \\ 0.190\% & 10uA \le A_{Ix} \le 20uA, 0.01m\Omega \le R_{x\_3m} \le 0.02m\Omega \end{cases} \quad \text{Equation (15)}$$

The impedance measurement device 100a includes a plurality of switching devices. The plurality of switching devices may be operated to transition the impedance measurement device 100a from calibration operation to testing operation.

Figure 3:
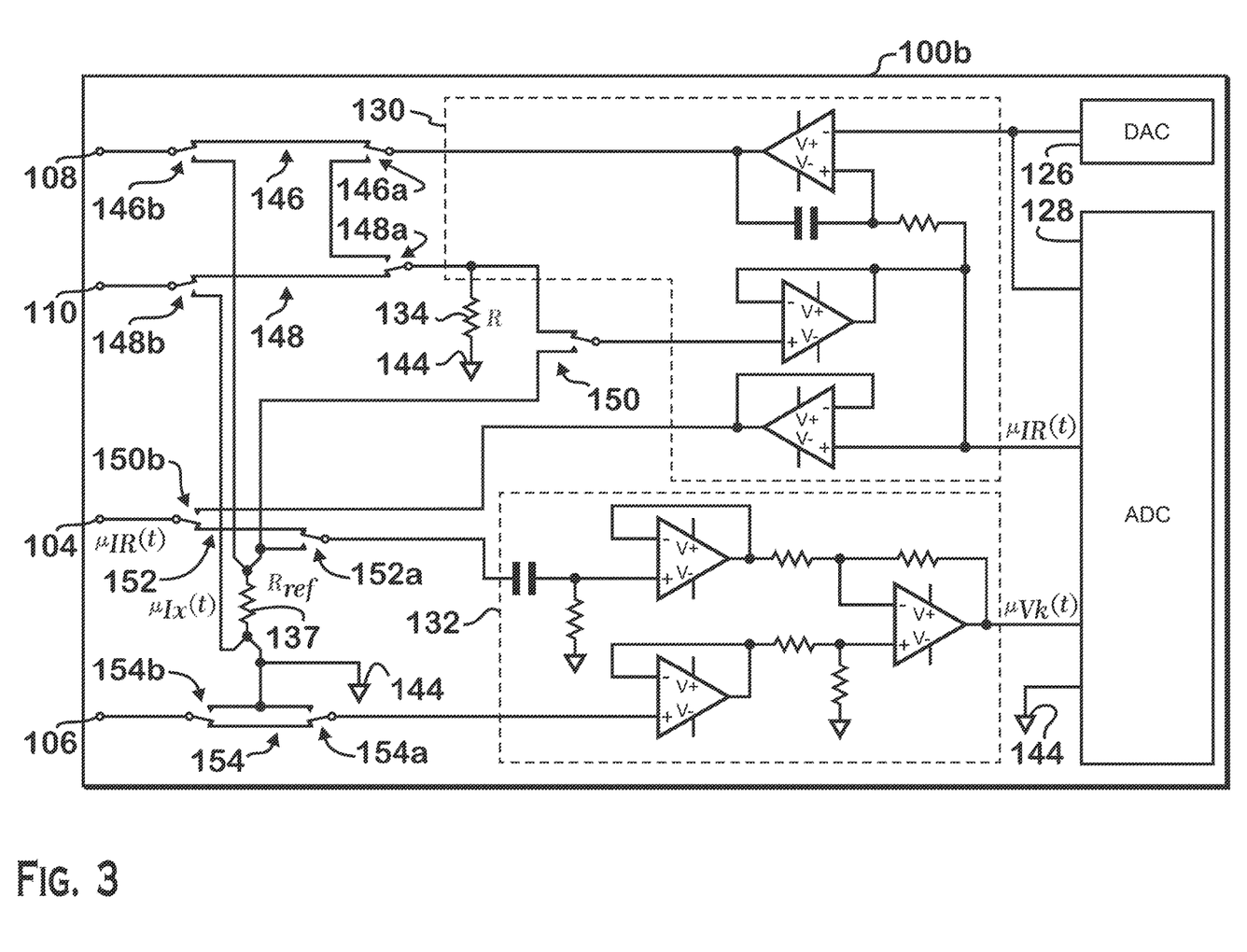
FIG. 3 shows the impedance measurement device including a plurality of switching devices for switching between calibration and testing operation.

FIG. 3 shows the impedance measurement device 100b including the plurality of switching devices for switching between calibration and testing operation. The impedance measurement device 100b includes first, second, third, fourth and fifth switching devices 146, 148, 150, 152, 154. During testing, the first and third terminals 104, 108 of the impedance measurement device 100b may be coupled to a first terminal (for example, an anode) of a device under test, which may be a battery. The second and fourth terminals 106, 110 may be coupled to a second terminal (for example, a cathode) of the device under test. The terminals 104, 106, 108, 110 are selectively bi-directional, and the function of the terminals 104, 106, 108, 110 is switched during testing as compared to calibration. During testing, the first and second terminals 104, 106 operate as input terminals, whereas the third and fourth terminals 108, 110 operate as output terminals of the impedance measurement device 100b.

The first switching device 146 includes two switches 146a, 146b that operate to couple the third terminal 108 to the first channel 130 or the reference resistance 137. The second switching device 148 includes two switches 148a, 148b that operate to couple the fourth terminal 110 to the first channel 130 or the reference resistance 137. The first and second switching devices 146, 148 further couple or decouple the first channel 130 to/from the sampling resistance 134. The third switching device 150 couples the first channel 130 to the sampling resistance 134 or decouple the first channel 130 from the sampling resistance 134.

The fourth switching device 152, includes two switches 152a, 152b, couples the first terminal 104 to the first channel 130 or the second channel 132 and couples the reference resistance 137 to the second channel 132 or decouples the reference resistance 137 from the second channel 132. The fifth switching device 154 includes two switches 154a, 154b and couples the second terminal 106 to the second channel 132 or to the reference resistance 137.

The switching devices 146-154 are shown in FIG. 3 as positioned when the impedance measurement device 100b is used for testing. It is noted that switching the state of each of the switching devices 146-154 from the positions shown in FIG. 3 configures the impedance measurement device 100b for calibration, which results in the arrangement of FIG. 2.

It is noted that in an embodiment, the switching devices 146-154 maybe foregone. For example, the sampling and reference resistances 134, 137 may be in a resistance box instead of being part of the impedance measurement device. Accordingly, physical coupling of the impedance measurement device to the resistance box and physical coupling of the resistance box to the phase-locked current generator 124 substitute for use of the switching devices 146-154 in placing the impedance measurement device in calibration operation. Physical decoupling of the impedance measurement device from the resistance box substitutes for use of the switching devices 146-154 in placing the impedance measurement device in testing operation.

Figure 4:
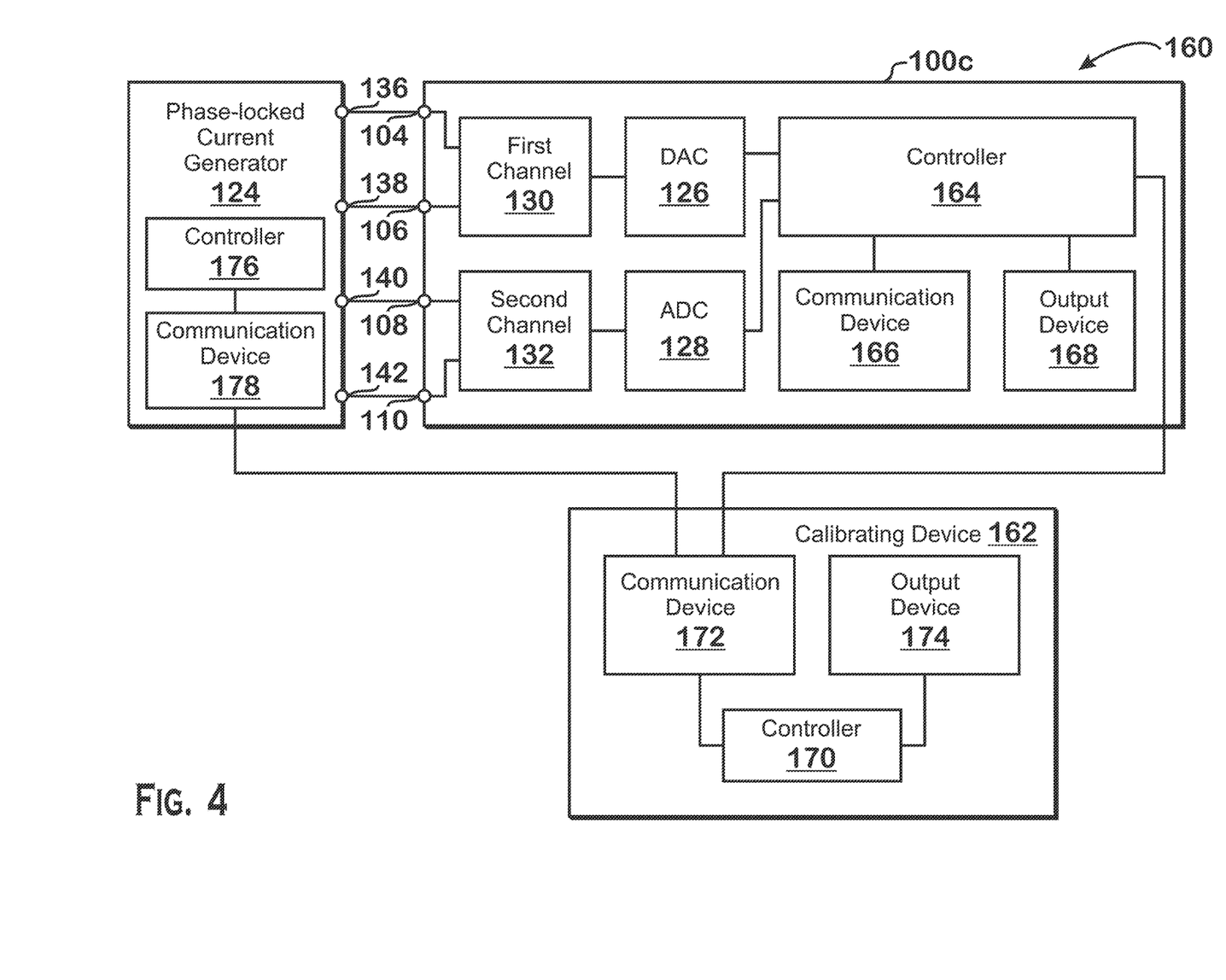
FIG. 4 shows a system for calibrating the impedance measurement device.

FIG. 4 shows a system 160 for calibrating an impedance measurement device 100c. It is noted that the impedance measurement device 100c may be similarly or identically configured as the impedance measurement devices 100a, 100b described herein. The system 160 includes the impedance measurement device 100c, the phase-locked current generator 124 and a calibrating device 162. The calibrating device 162 may calibrate the impedance measurement device 100c, whereby, for example, the calibrating device 162 may determine and the adjustment factor(s) and configure the impedance measurement device 100c with the adjustment factor(s). Similar elements of the impedance measurement device 100c as the impedance measurement device 100a described herein have the same reference numeral. The impedance measurement device 100c includes a controller 164, a communication device 166 and an output device 168. Similarly, the calibrating device 162 includes a controller 170, a communication device 172 and an output device 174. In addition, the phase-locked current generator 124 includes a controller 176 and a communication device 178.

The controller 164 may be any type of device configured to perform the techniques described herein. The controller 164 may be a processor, a microcontroller or a microprocessor, among others, and may include an arithmetic and logic unit (ALU), among other computational units. The controller 164 may be an embedded system-on-chip (SoC). The controller 164 may include a central processing unit (CPU) or graphics processing unit (GPU), among others. The controller 164 may control the digital-to-analog converter 126 to generate and output the signal ($\mu_I(t)$) to the first channel 130 as described herein. Further, the controller 164 may receive a digital signal representative of the second voltage signal ($\mu_{V_R}(t)$) from the analog-to-digital converter 128. Further, the controller 164 may determine the detected impedance ($Z_{Ox}$), phase-shift the detected impedance ($Z_{Ox}$) to produce the phase-shifted measured impedance ($Z_{\theta 0x}$) and apply the adjustment factor ($k_{Ox}$) to the phase-shifted measured impedance ($Z_{\theta 0x}$) to generate the read-out impedance. The controller 164 may be calibrated and configured with the adjustment factor ($k_{Ox}$), whereby calibrating the impedance measurement device, as described herein, includes calibrating the controller 164 of the impedance measurement device.

The controller 164 may execute executable instructions stored in memory (not shown). When the executable instructions are executed by the controller 164, the executable instructions cause the controller 164 to perform the functions or techniques described herein. The controller 164 may send any determined impedance to the communication device 166 for transmission to another device or to the output device 168 for output to a user.

The communication device 166 may be any type of device that is operable to communicate with another device. The communication device 166 may be a transmitter, receiver, transceiver or modem, among others. The communication device 166 may be configured to communicate using any type of communication protocol. The protocol may be a cellular communication protocol, such as long term evolution (LTE), or a wireless communication protocol, such as the Institute of Electrical and Electronics Engineers (IEEE) 802 protocol, among others. The protocol may be a near-field communication protocol, such as Bluetooth®. The communication device 166 may transmit the determined impedance to the calibrating device 162.

The output device 168 may be any type of device configured to output data to a user. For example, the output device 168 may be a display or a speaker, among others. The output device 168 may output, to a user, a result of the impedance measurement performed by the impedance measurement device 100c.

The controller 170, communication device 172 and the output device 174 of the calibrating device 162 may be similar devices as the controller 164, communication device 166 and output device 168, respectively, of the impedance measurement device 100c. The controller 170 may control the impedance measurement device 100c and the phase-locked current generator 124 to calibrate the impedance measurement device 100c (or the controller 164 thereof). The controller 170 may command the phase-locked current generator 124 to lock to the phase of the first AC signal ($\mu_{I_R}(t)$) and set the amplitude of the second AC signal ($\mu_{I_x}(t)$) to specify the presented impedance.

The controller 170 may receive the phase-shifted measured impedance ($Z_{\theta 0x}$) and determine the adjustment factor ($k_{0x}$) for the presented impedance ($Z_x$). The controller 170 may also determine a plurality of adjustment factors for a plurality of presented impedances. The controller 170 may extrapolate the adjustment factors to determine a relationship between the phase-shifted measured impedance ($Z_{\theta 0x}$) determined by the impedance measurement device 100c and the adjustment factor ($k_{0x}$). For example, the relationship may be a functional relation (e.g., linear or quadratic, among other). The adjustment factor may be a variable that changes as a function of the phase-shifted measured impedance ($Z_{\theta 0x}$). A curve may represent the relationship between the adjustment factor and the phase-shifted measured impedance ($Z_{\theta 0x}$).

In addition, the relationship may be represented as a look-up table. The controller 170 may send, using the communication device 172, the adjustment factor to the impedance measurement device 100c. The impedance measurement device 100c may use the adjustment factor in adjusting phase-shifted measured impedances, during operation, to respective read-out impedances.

The controller 176 and communication device 178 of the phase-locked current generator 124 may be similar devices as the controller 164 and communication device 166, respectively, of the impedance measurement device 100c. The communication device 178 may receive, from the communication device 172 of the calibrating device 162, the command to lock to the phase of the first AC signal ($\mu_{IR}(t)$). Further, the communication device 178 may receive an indication of the amplitude of the second AC signal ($\mu_{Ix}(t)$). The communication device 178 may output data representative of the command and the amplitude to the controller 176.

The controller 176 may control the phase-locked current generator 124 to cause the phase-locked current generator 124 to perform the techniques described herein. The controller 176 may control the phase-locked current generator 124 to lock the phase of the second AC signal ($\mu_{Ix}(t)$) to the phase of the first AC signal ($\mu_{IR}(t)$). The controller 176 may output the second AC signal ($\mu_{Ix}(t)$) having the amplitude commanded by the calibrating device 162.

It is noted that in an alternative embodiment, the calibrating device 162 may be forgone, and the impedance measurement device 100c may perform the functionality of the calibrating device 162. For example, the communication device 166 of the impedance measurement device 100c may be coupled to the communication device 178 of the phase-locked current generator 124. Adjustment factor determination and command of the phase-locked current generator 124 may be performed by the controller 164 of the impedance measurement device 100c.

Figure 5:
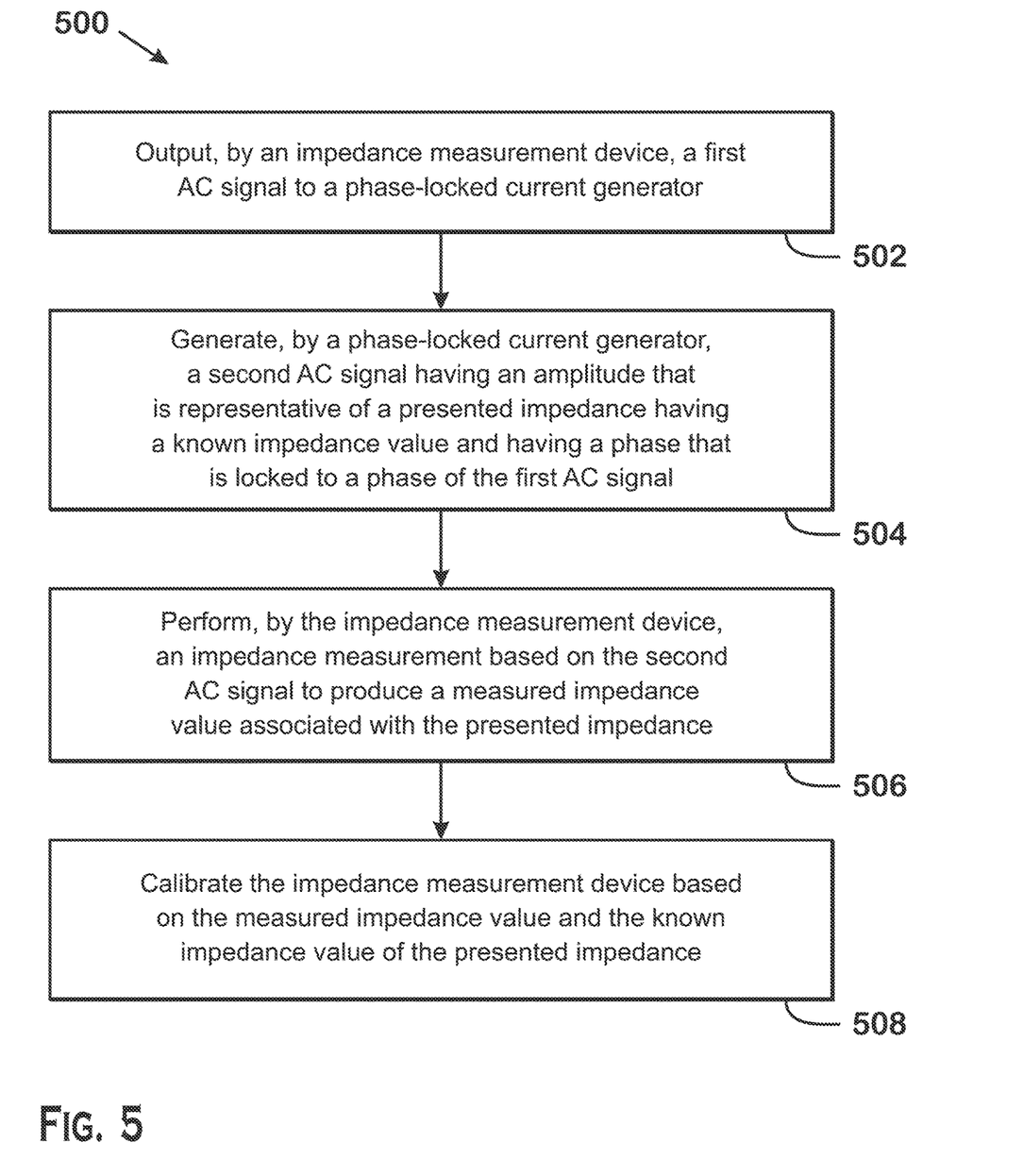
FIG. 5 shows a flow diagram of a method for calibrating the impedance measurement device.

FIG. 5 shows a flow diagram of a method 500 for calibrating an impedance measurement device. In the method 500, an impedance measurement device, such as the impedance measurement device 100a described with reference to FIG. 2, outputs a first AC signal to a phase-locked current generator at 502. At 504, the phase-locked current generator generates a second AC signal having an amplitude that is representative of a presented impedance having a known impedance value and having a phase that is locked to a phase of the first AC signal. The phase-locked current generator outputs the second AC signal to the impedance measurement device. At 506, the impedance measurement device performs an impedance measurement based on the second AC signal to produce a measured impedance value associated with the presented impedance. As described herein, the impedance measurement device may determine the impedance measurement as a ratio between a voltage generated from the second AC signal and a current used to generate the first AC signal. Further, the impedance measurement device may phase-shift the impedance measurement to compensate for phase changes due to the processing performed by the impedance measurement device.

The method 500 includes, at 508, calibrating the impedance measurement device based on the measured impedance value and the known impedance value of the presented impedance. As described herein, calibrating the impedance measurement device may include configuring the impedance measurement device with an adjustment factor. The adjustment factor may be determined based on the measured impedance and the known impedance value of the simulated impedance. During operation, the impedance measurement device adjusts measured impedances based on the adjustment factor to produce respective read-out impedance measurements.

As described herein, the sampling and reference resistances 134, 137 may be in a resistance box instead of being part of the impedance measurement device.

Figure 6:
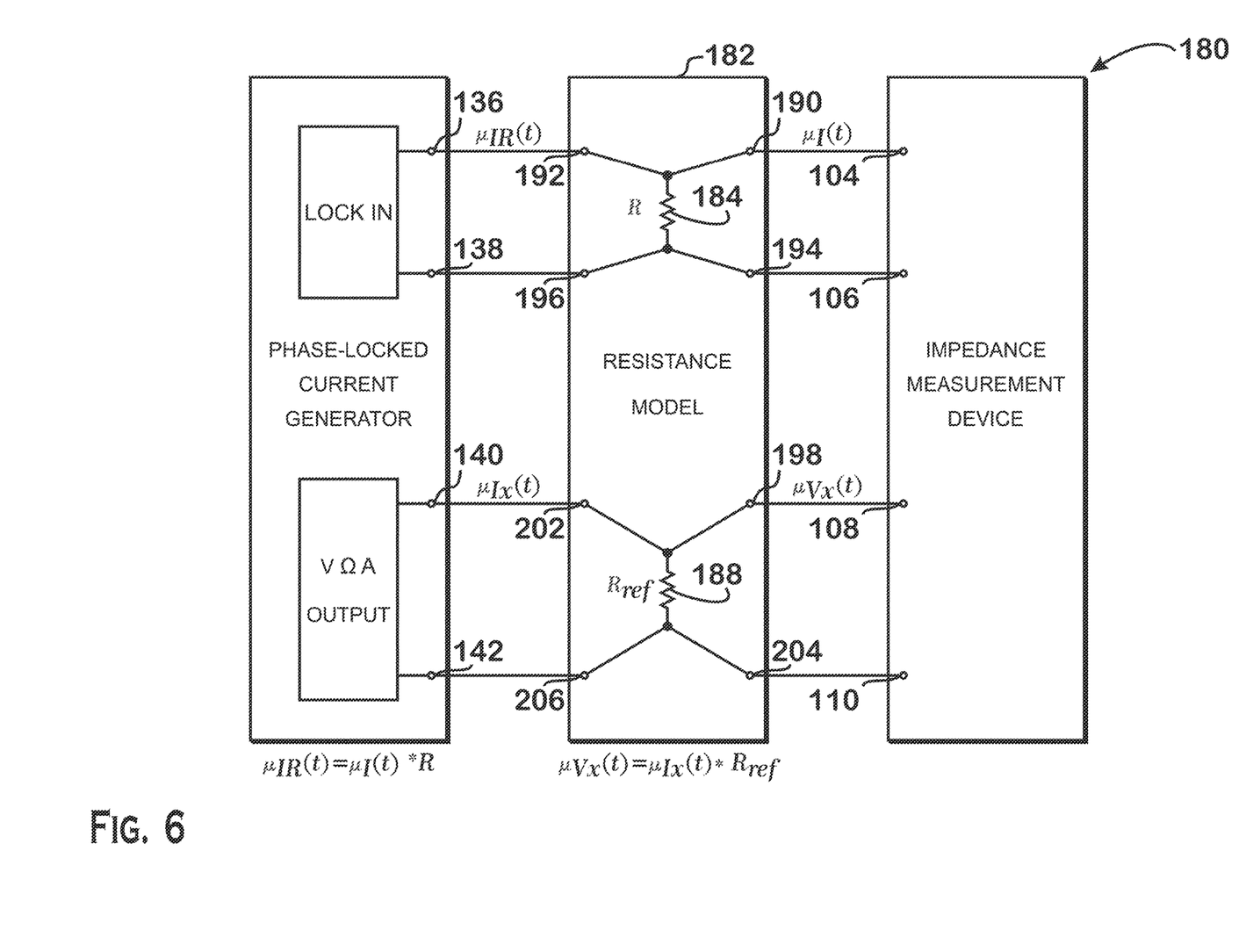
FIG. 6 shows a system for calibrating the impedance measurement device.

FIG. 6 shows a system 180 for calibrating an impedance measurement device 100d. The system 180 includes the impedance measurement device 100d, a resistance model 182 and the phase-locked current generator 124. The resistance model 182, which may be a resistance box, includes sampling and reference resistances 184, 188. Thus, the sampling and reference resistances 134, 137 are not incorporated into the impedance measurement device 100d. In the mode in which the resistances 134, 137 are not incorporated into the impedance measurement device 100d, the device is configured in a normal test mode shown with reference to FIG. 3 herein. As described herein with reference to FIG. 3, the reference resistance 137 is bypassed by operation of the switching devices 152, 154. Similar elements of the impedance measurement device 100d as the impedance measurement device 100b described with reference to FIG. 3 herein have the same reference numerals.

The resistance model 182 has first, second, third and fourth sampling resistance terminals 190, 192, 194, 196 and first, second, third and fourth reference resistance terminals 198, 202, 204, 206. The first and second sampling resistance terminals 190, 192 are coupled to a first terminal of the sampling resistance 184. The third and fourth sampling resistance terminals 194, 196 are coupled to a second terminal of the sampling resistance 184. The first and second reference resistance terminals 198, 202 are coupled to a first terminal of the reference resistance 188. The third and fourth reference resistance terminals 204, 206 are coupled to a second terminal of the reference resistance 188.

The first and second terminals 104, 106 of the impedance measurement device 100d are coupled to the first and third sampling resistance terminals 190, 194, respectively. The first and second inputs 136, 138 of the phase-locked current generator 124 are coupled to the second and fourth sampling resistance terminals 192, 196, respectively.

The third and fourth terminals 108, 110 of the impedance measurement device 100d are coupled to the first and third reference resistance terminals 198, 204, respectively. The first and second outputs 140, 142 of the phase-locked current generator 124 are coupled to the second and fourth reference resistance terminals 202, 206, respectively.

As described herein, impedance measurement device 100d generates the signal ($\mu_I(t)$). The impedance measurement device 100d outputs the signal ($\mu_I(t)$) to the sampling resistance 184. The signal ($\mu_I(t)$) results in the first AC signal ($\mu_{IR}(t)$) across the sampling resistance 184. The phase-locked current generator 124 receives the first AC signal ($\mu_{IR}$ (t)). As described herein, the phase-locked current generator 124 generates the second AC signal ($\mu_{Ix}(t)$). The phase-locked current generator 124 outputs the second AC signal ($\mu_{Ix}(t)$) to the resistance model 182. The second AC signal ($\mu_{Ix}(t)$) results in a voltage drop of the first voltage signal ($\mu_{Vx}(t)$) across the reference resistance 188. The impedance measurement device 100d receives the first voltage signal ($\mu_{Vx}(t)$) generated by the resistance model 182. The system 180 decouples the sampling and reference resistances from the impedance measurement device and provides for the resistances to be placed in a resistance model couplable to the impedance measurement device.

In view of the foregoing disclosure, various examples of a method for calibrating an impedance measurement device, the impedance measurement device and a system for calibrating the impedance measurement device may include any one or combination of the following features: outputting a first AC signal; receiving a second AC signal having a phase that is locked to a phase of the first AC signal; performing an impedance measurement based on the second AC signal to produce a measured impedance value associated with a presented impedance; and calibrating an impedance measurement device based on the measured impedance value and a known impedance value of the presented impedance.

The method, device and system may include another feature, such as outputting the first AC signal to a phase-locked current generator and receiving the second AC signal from the phase-locked current generator.

The method, device and system may include another feature, such as the second AC signal having an amplitude that is representative of the presented impedance having the known impedance value.

The method, device and system may include another feature, such as the impedance measurement being performed by the impedance measurement device.

The method, device and system may include another feature, such as changing the amplitude of the second AC signal to change the presented impedance provided by the phase-locked current generator. The method, device and system may include another feature, such as a granularity of the change in the presented impedance corresponding to a granularity, provided by the phase-locked current generator, of the change in the amplitude of the second AC signal.

The method, device and system may include another feature, such as changing the amplitude of the second AC signal from a first amplitude to a second amplitude. The method, device and system may include another feature, such as the second amplitude being different from the first amplitude by a finest step-wise setting provided by the phase-locked current generator.

The method, device and system may include another feature, such as determining an adjustment factor based on the measured impedance value and the known impedance value of the presented impedance. The method, device and system may include another feature, such as adjusting measured impedance values to produce respective read-out impedance measurements based on the adjustment factor.

The method, device and system may include another feature, such as the adjustment factor varying linearly as a function of the presented impedance. The method, device and system may include another feature, such as determining a plurality of adjustment factors based on a respective plurality of pairs of measured impedance values and corresponding presented impedances and by extrapolating between the plurality of adjustment factors.

The method, device and system may include another feature, such as passing the second AC signal through a reference resistance included in the impedance measurement device. The method, device and system may include another feature, such as detecting a voltage signal across the reference resistance. The method, device and system may include another feature, such as passing a current signal through a sampling resistance. The method, device and system may include another feature, such as detecting the first AC signal across the sampling resistance. The method, device and system may include another feature, such as determining the measured impedance value as a ratio of the voltage signal and the current signal. The method, device and system may include another feature, such as phase-shifting the measured impedance value to account for processing performed by the impedance measurement device.

The method, device and system may include another feature, such as determining an adjustment factor as a ratio between the measured impedance value and the known impedance value of the presented impedance. The method, device and system may include another feature, such as the second AC signal being operative to cause the voltage signal across the reference resistance to be between 10 nV and 1 mV.

The method, device and system may include another feature, such as an output terminal of the impedance measurement device being configured to output the first AC signal to a phase-locked current generator; an input terminal of the impedance measurement device being configured to receive the second AC signal; and a controller of the impedance measurement device being configured to perform the impedance measurement.

The method, device and system may include another feature, such as changing the amplitude of the second AC signal by the phase-locked current generator. The method, device and system may include another feature, such as changing the amplitude of the second AC signal from a first amplitude to a second amplitude by the phase-locked current generator. The method, device and system may include another feature, such as the controller of the impedance measurement device being configured with the adjustment factor and being configured to adjust the measured impedance values.

The method, device and system may include another feature, such as the sampling resistance being incorporated into the impedance measurement device. The method, device and system may include another feature, such as the sampling resistance being coupled to the output terminal and configured to receive a current signal. The method, device and system may include another feature, such as the sampling resistance being configured to generate the first AC signal in response to passage therethrough of the current signal.

The method, device and system may include another feature, such as the reference resistance being incorporated into the impedance measurement device. The method, device and system may include another feature, such as the reference resistance being coupled to the input terminal and configured to receive the second AC signal. The method, device and system may include another feature, such as the reference resistance being configured to generate the voltage signal in response to passage therethrough of the second AC signal.

The method, device and system may include another feature, such as the impedance measurement device being configured to determine the measured impedance value.

The method, device and system may include another feature, such as the phase-locked current generator including an input terminal coupled to the output terminal of the impedance measurement device and configured to receive the first AC signal; a controller configured to cause the second AC signal to be generated having a phase that is locked to a phase of the first AC signal; and an input terminal coupled to the input terminal of the impedance measurement device and configured to output the second AC signal.

The method, device and system may include another feature, such as the controller of the phase-locked current generator being configured to change the amplitude of the second AC signal to change the presented impedance. The method, device and system may include another feature, such as the controller of the phase-locked current generator being configured to change the amplitude of the second AC signal from a first amplitude to a second amplitude.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An impedance measurement device, comprising:
    an output terminal configured to output a first AC signal to a phase-locked current generator;
    an input terminal configured to receive a second AC signal generated by the phase-locked current generator and having a phase that is locked to a phase of the first AC signal and an amplitude that is representative of a presented impedance having a known impedance value; and
    a controller configured to:
        perform an impedance measurement based on the second AC signal to produce a measured impedance value associated with the presented impedance; and
        be calibrated based on the measured impedance value and the known impedance value of the presented impedance.

2. The impedance measurement device of claim 1, wherein:
    the phase-locked current generator, in operation, changes the amplitude of the second AC signal,
    the presented impedance changes in response to changing the amplitude of the second AC signal, and
    a first granularity of the change in the presented impedance corresponds to a second granularity, provided by the phase-locked current generator, of the change in the amplitude of the second AC signal.

3. The impedance measurement device of claim 1, wherein the input terminal is configured to receive a third AC signal generated by the phase-locked current generator and having an amplitude that is different from the amplitude of the second AC signal by a finest step-wise setting provided by the phase-locked current generator.

4. The impedance measurement device of claim 1, wherein the controller is configured to, based on an adjustment factor, adjust measured impedance values to produce respective read-out impedance measurements, the adjustment factor being determined based on the measured impedance value and the known impedance value of the presented impedance.

5. The impedance measurement device of claim 4, wherein:
    the adjustment factor varies linearly as a function of the presented impedance,
    the controller is configured to be calibrated with a plurality of adjustment factors that are determined based on a respective plurality of pairs of measured impedance values and corresponding presented impedances, and
    the controller is configured to be calibrated with an extrapolated adjustment factor that is determined by extrapolating between first and second adjustment factors of the plurality of adjustment factors.

6. The impedance measurement device of claim 1, comprising:
    a sampling resistance coupled to the output terminal and configured to receive a current signal, wherein the sampling resistance is configured to generate the first AC signal in response to passage therethrough of the current signal; and
    a reference resistance coupled to the input terminal and configured to receive the second AC signal, wherein the reference resistance is configured to generate a voltage signal in response to passage therethrough of the second AC signal,
    wherein the impedance measurement device is configured to determine the measured impedance value based on a ratio of the voltage signal to the current signal, and the measured impedance value is phase-shifted to compensate for phase-shifting performed during processing by the impedance measurement device.

7. The impedance measurement device of claim 6, wherein the second AC signal is operative to cause the voltage signal across the reference resistance to be between 10 nanovolt (nV) and one millivolt (mV).

8. The impedance measurement device of claim 1, wherein an adjustment factor is determined as a ratio between the measured impedance value and the known impedance value of the presented impedance.

9. A method for calibrating an impedance measurement device, comprising:
    outputting a first AC signal to a phase-locked current generator;
    receiving a second AC signal generated by the phase-locked current generator and having a phase that is locked to a phase of the first AC signal and an amplitude that is representative of a presented impedance having a known impedance value;
    performing, by the impedance measurement device, an impedance measurement based on the second AC signal to produce a measured impedance value associated with the presented impedance; and
    calibrating the impedance measurement device based on the measured impedance value and the known impedance value of the presented impedance.

10. The method of claim 9, further comprising:
    changing the amplitude of the second AC signal; and
    causing the presented impedance to change in response to changing the amplitude of the second AC signal, wherein:
        a first granularity of the change in the presented impedance corresponds to a second granularity, provided by the phase-locked current generator, of the change in the amplitude of the second AC signal.

11. The method of claim 9, further comprising:
    receiving a third AC signal generated by the phase-locked current generator and having an amplitude that is different from the amplitude of the second AC signal by a finest step-wise setting provided by the phase-locked current generator.

12. The method of claim 9, further comprising:
determining an adjustment factor based on the measured impedance value and the known impedance value of the presented impedance; and
based on the adjustment factor, adjusting measured impedance values to produce respective read-out impedance measurements.

13. The method of claim 12, wherein the adjustment factor varies linearly as a function of the presented impedance, and the method further comprises:
determining a plurality of adjustment factors based on a respective plurality of pairs of measured impedance values and corresponding presented impedances;
determining an extrapolated adjustment factor by extrapolating between first and second adjustment factors of the plurality of adjustment factors; and
calibrating the impedance measurement device with the plurality of adjustment factors and the extrapolated adjustment factor.

14. The method of claim 9, further comprising:
passing the second AC signal through a reference resistance included in the impedance measurement device;
detecting a voltage signal across the reference resistance;
passing a current signal through a sampling resistance;
detecting the first AC signal across the sampling resistance;
determining the measured impedance value as a ratio of the voltage signal and the current signal; and
phase-shifting the measured impedance value to compensate for phase-shifting performed during processing by the impedance measurement device.

15. The method of claim 14, further comprising:
detecting the voltage signal across the reference resistance to be between 10 nanovolt (nV) and one millivolt (mV).

16. The method of claim 9, further comprising:
determining an adjustment factor as a ratio between the measured impedance value and the known impedance value of the presented impedance.

17. A system, comprising:
an impedance measurement device including:
an output terminal configured to output a first AC signal;
an input terminal configured to receive a second AC signal having an amplitude that is representative of a presented impedance having a known impedance value; and
a controller configured to:
perform an impedance measurement based on the second AC signal to produce a measured impedance value associated with the presented impedance; and
be calibrated based on the measured impedance value and the known impedance value of the presented impedance; and
a phase-locked current generator including:
an input terminal coupled to the output terminal of the impedance measurement device and configured to receive the first AC signal;
a controller configured to cause the second AC signal to be generated having a phase that is locked to a phase of the first AC signal; and
an output terminal coupled to the input terminal of the impedance measurement device and configured to output the second AC signal.

18. The system of claim 17, wherein:
the controller of the phase-locked current generator is configured to change the amplitude of the second AC signal,
the presented impedance changes in response to changing the amplitude of the second AC signal, and
a first granularity of the change in the presented impedance corresponds to a second granularity, provided by the phase-locked current generator, of the change in the amplitude of the second AC signal.

19. The system of claim 17, wherein the controller of the phase-locked current generator is configured to:
generate a third AC signal having an amplitude that is different from the amplitude of the second AC signal by a finest step-wise setting provided by the phase-locked current generator.

20. The system of claim 17, wherein the controller of the impedance measurement device is configured to, based on an adjustment factor, adjust measured impedance values to produce respective read-out impedance measurements, the adjustment factor being determined based on the measured impedance value and the known impedance value of the presented impedance.

* * * * *